(12) United States Patent
Siddik et al.

(10) Patent No.: US 11,751,393 B2
(45) Date of Patent: Sep. 5, 2023

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Manzar Siddik, Boise, ID (US); Chris M. Carlson, Nampa, ID (US); Terry H. Kim, Boise, ID (US); Kunal Shrotri, Boise, ID (US); Srinath Venkatesan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/524,987

(22) Filed: Nov. 12, 2021

(65) Prior Publication Data
US 2022/0077186 A1    Mar. 10, 2022

Related U.S. Application Data

(62) Division of application No. 16/705,388, filed on Dec. 6, 2019, now Pat. No. 11,205,660.

(51) Int. Cl.
*H01L 27/11582*    (2017.01)
*H10B 43/27*    (2023.01)
*H01L 21/3215*    (2006.01)
*H01L 21/3115*    (2006.01)
*H10B 41/27*    (2023.01)

(52) U.S. Cl.
CPC .......... *H10B 43/27* (2023.02); *H01L 21/3115* (2013.01); *H01L 21/3215* (2013.01); *H10B 41/27* (2023.02)

(58) Field of Classification Search
None
See application file for complete search history.

(56) References Cited

U.S. PATENT DOCUMENTS

| 10,991,721 | B2 | 4/2021 | Rabkin et al. |
| 2016/0118391 | A1 | 4/2016 | Zhao et al. |
| 2017/0278859 | A1 | 9/2017 | Sharangpani et al. |

*Primary Examiner* — Long Pham
(74) *Attorney, Agent, or Firm* — Wells St. John P.S.

(57) ABSTRACT

A memory array comprising strings of memory cells comprises a vertical stack comprising alternating insulative tiers and conductive tiers. The strings of memory cells in the stack comprise channel-material strings and storage-material strings extending through the insulative tiers and the conductive tiers. At least some of the storage material of the storage-material strings in individual of the insulative tiers are intrinsically less charge-transmissive than is the storage material in the storage-material strings in individual of the conductive tiers. Other aspects, including method, are disclosed.

26 Claims, 18 Drawing Sheets

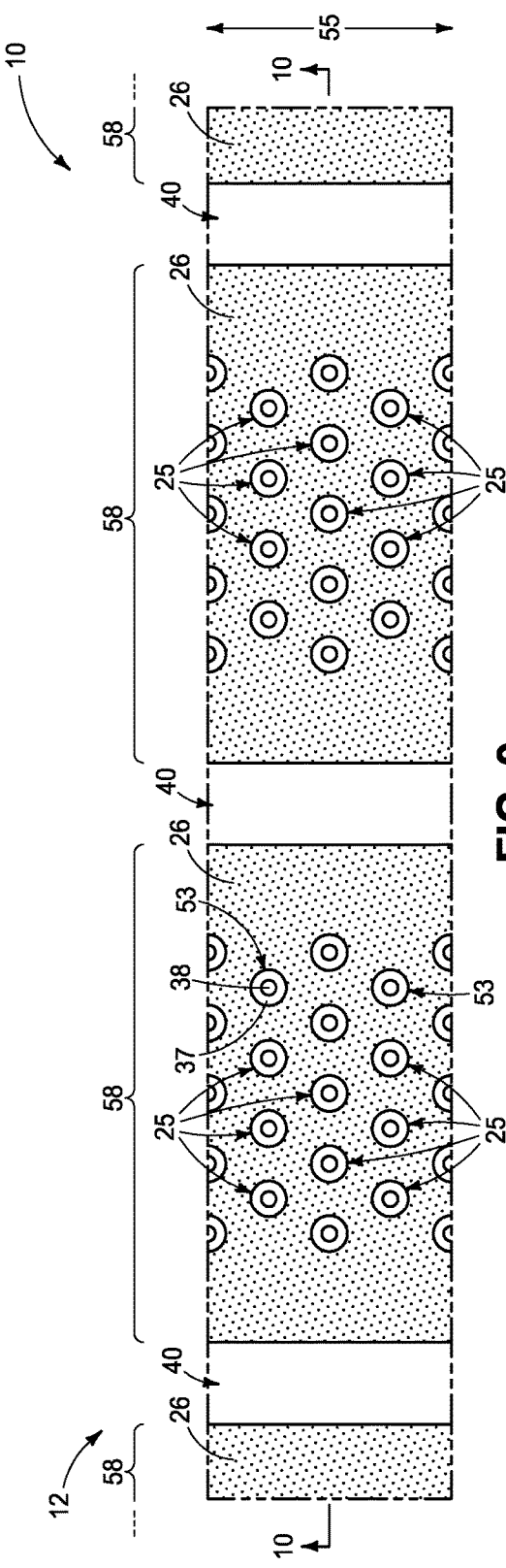
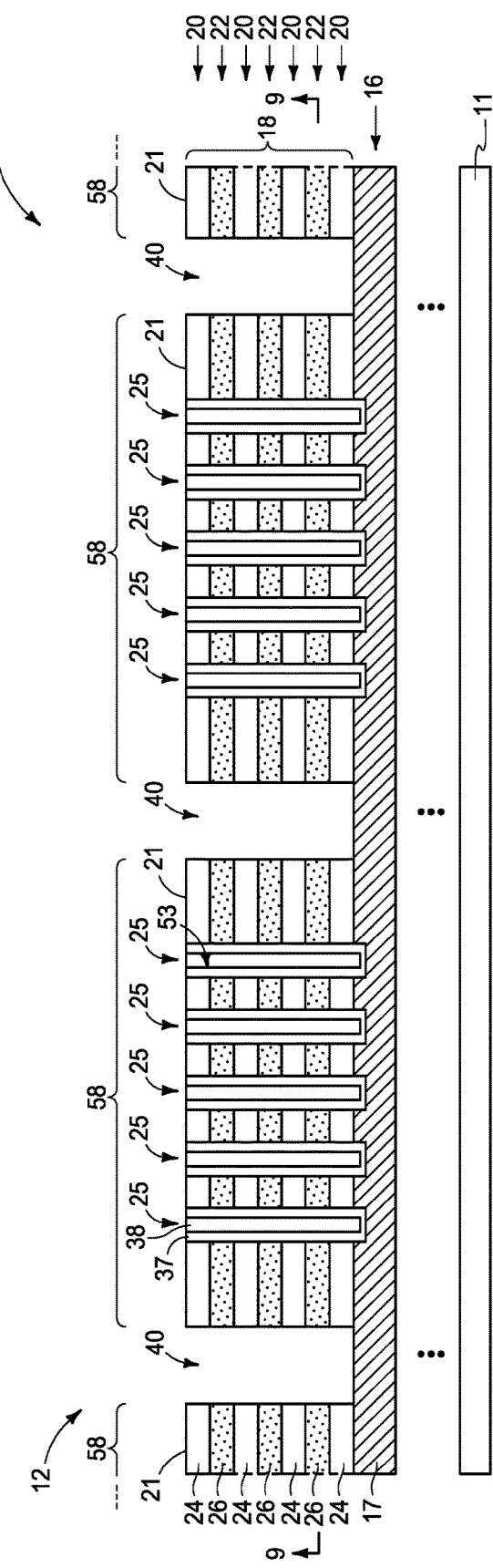
FIG. 9
FIG. 10

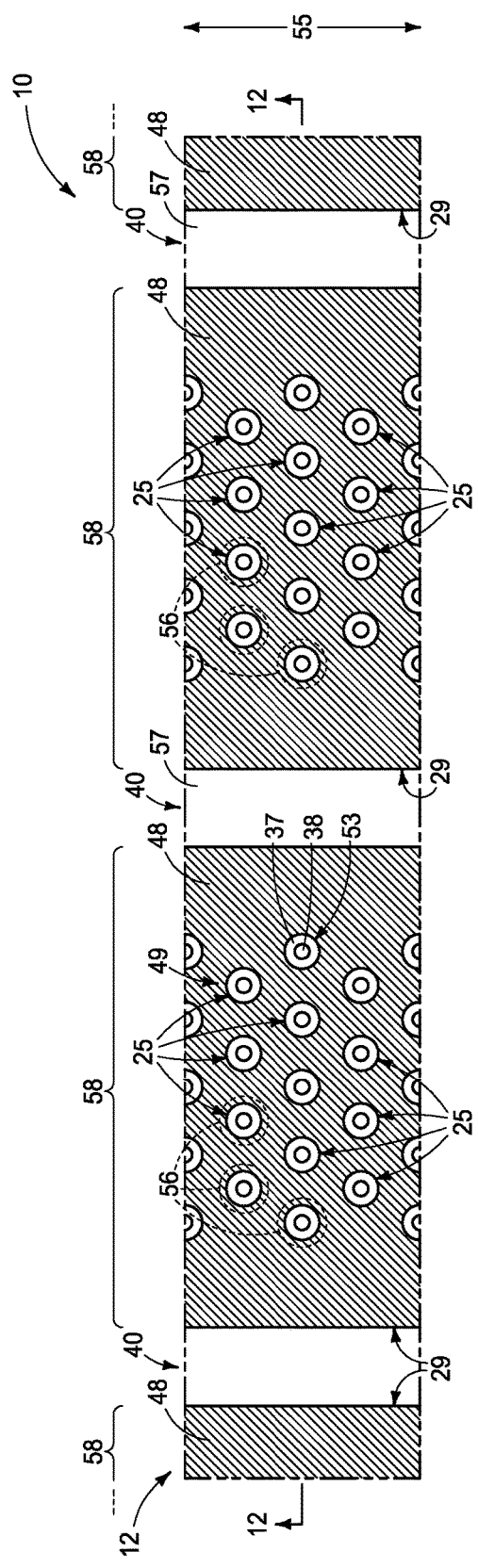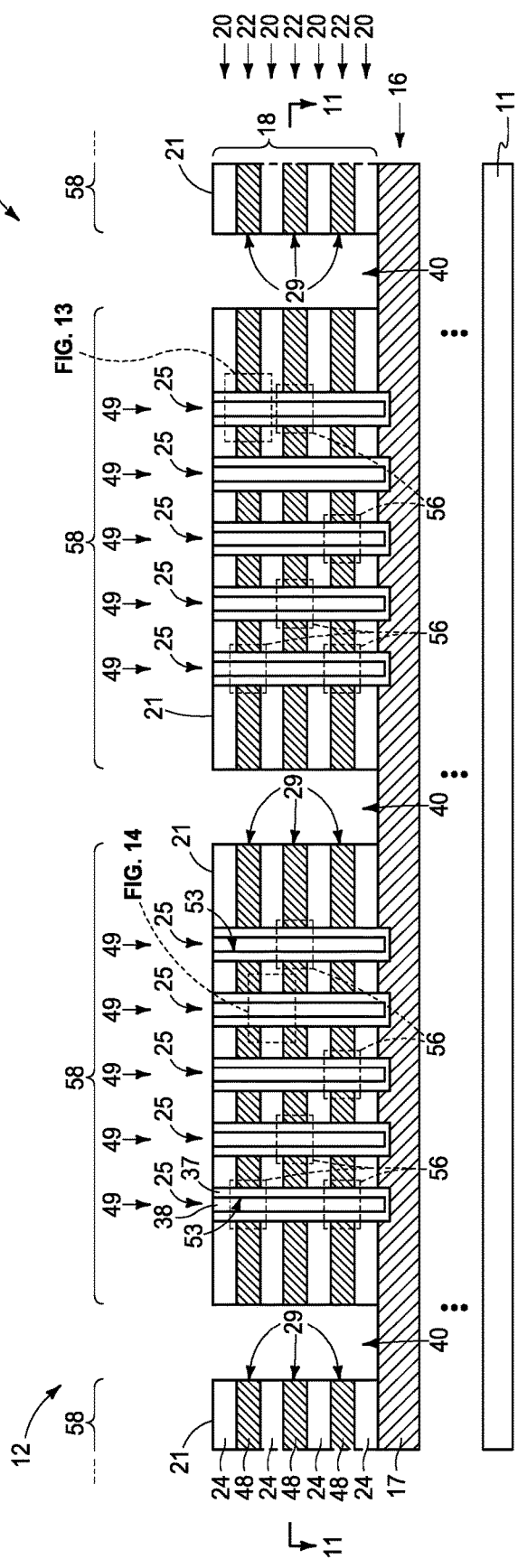

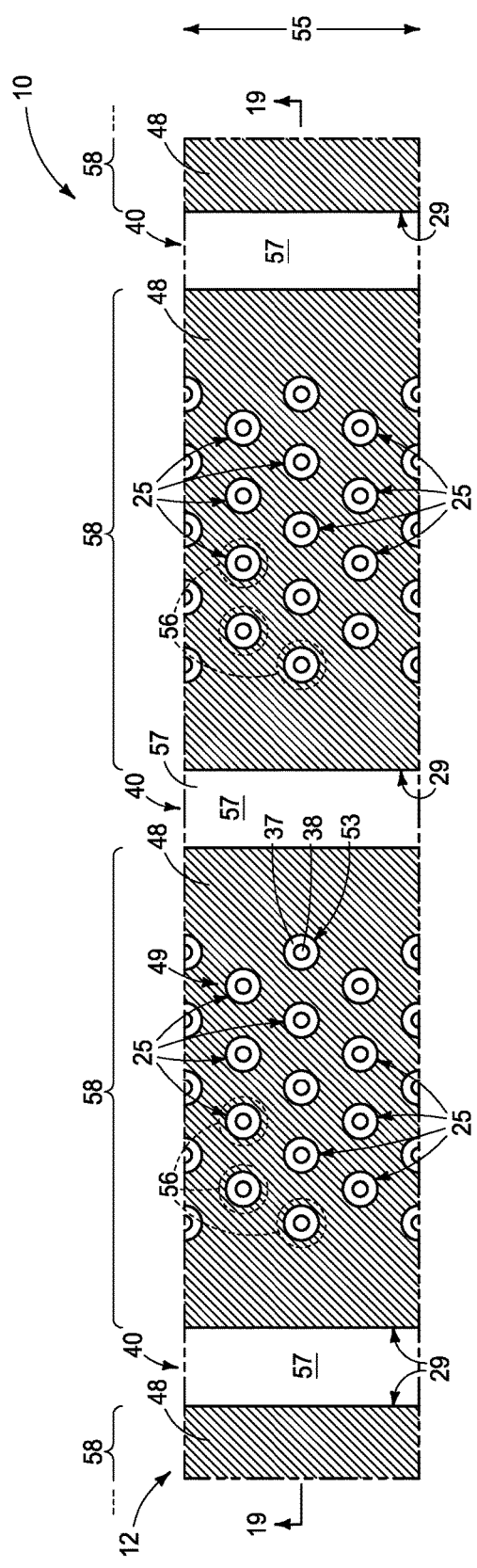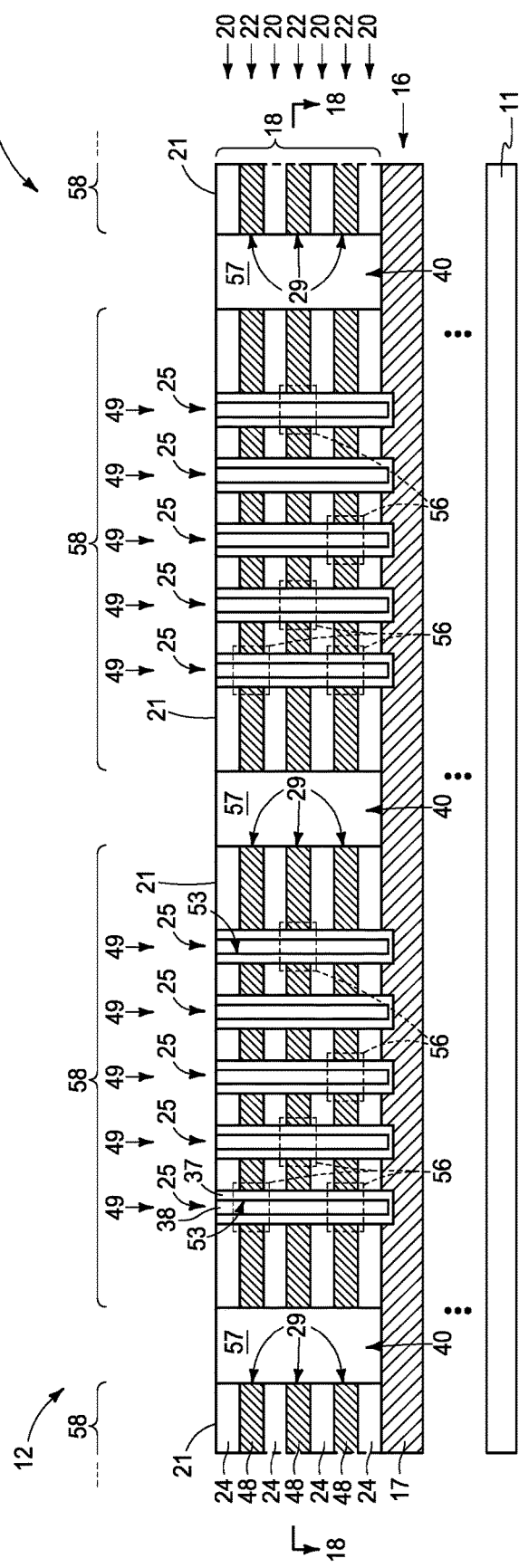

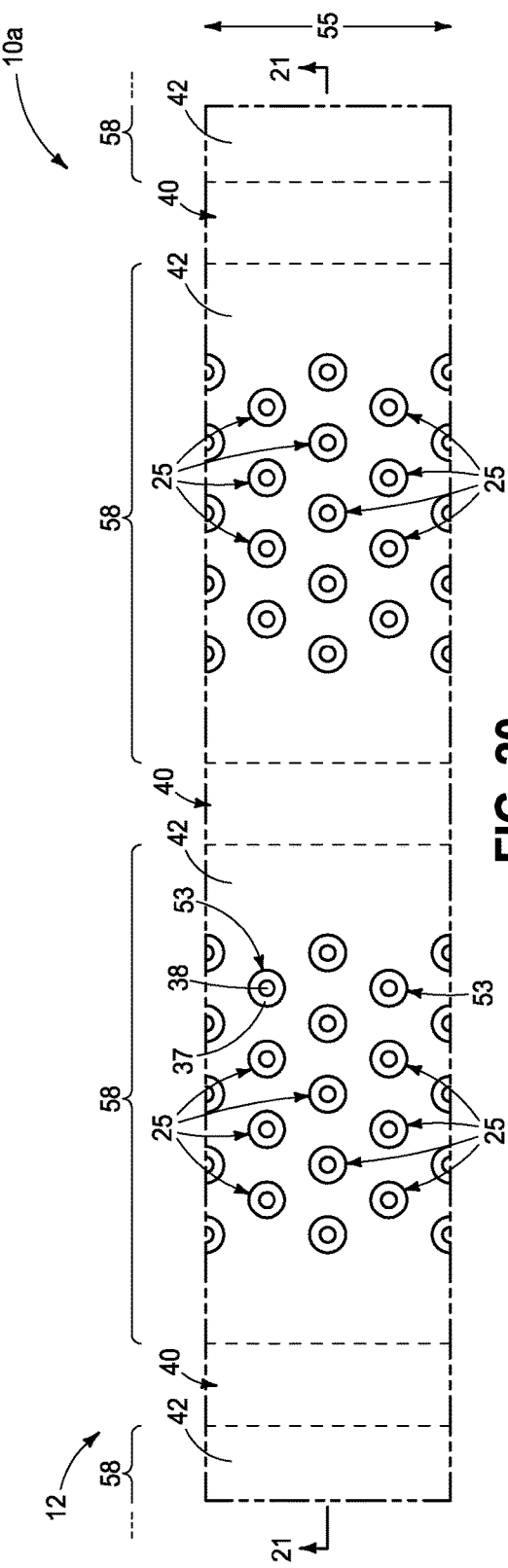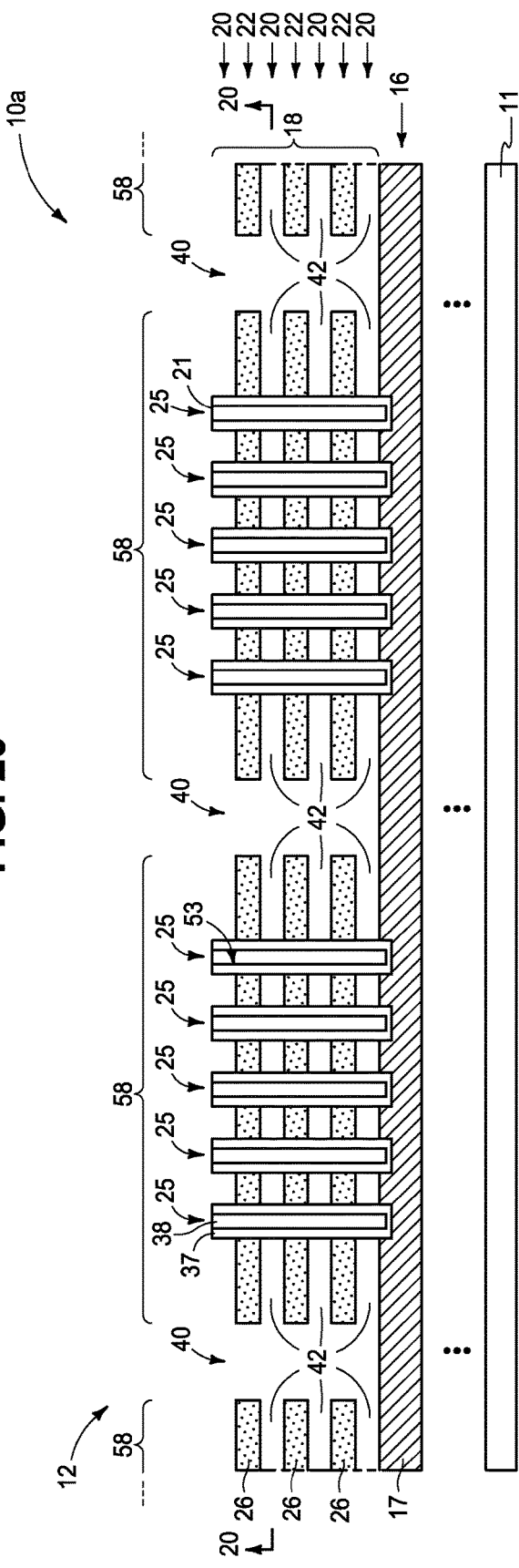

MEMORY ARRAYS AND METHODS USED IN FORMING A MEMORY ARRAY COMPRISING STRINGS OF MEMORY CELLS

RELATED PATENT DATA

This patent resulted from a divisional application of U.S. patent application Ser. No. 16/705,388, filed Dec. 6, 2019, entitled "Memory Arrays And Methods Used In Forming A Memory Array Comprising Strings Of Memory Cells", naming Manzar Siddik, Chris M. Carlson, Terry H. Kim, Kunal Shrotri, and Srinath Venkatesan as inventors, the disclosure of which is incorporated by reference.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

Vertically-stacked transistors and/or memory cells typically have at least their conductive gate material in horizontal tiers that are separated from one another by an intervening horizontal insulative tier. When those transistors/memory cells comprise charge-storage material, that material may only be within the tiers comprising the gate material. Alternately, the charge-storage material may be in a string that extends vertically-continuously through the stack. When a storage-material string is present and is programmed with charge (e.g., electrons) in one of more of the gate-material tiers, that charge can migrate vertically up and down thereby adversely depleting the charge from the gate-material tier(s). While the invention was motivated in addressing such issue, it is not so limited.

BRIEF DESCRIPTION OF THE DRAWINGS

FIGS. 3-19 are diagrammatic sequential sectional and/or enlarged views of the construction of FIGS. 1 and 2, or portions thereof, in process in accordance with some embodiments of the invention.

FIGS. 20-26 show alternate example method and/or structural embodiments of the invention.

DETAILED DESCRIPTION OF EXAMPLE EMBODIMENTS

Embodiments of the invention encompass methods used in forming a memory array comprising strings of memory cells, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-19 which may be considered as a "gate-last" or "replacement-gate" process.

Figure 1:
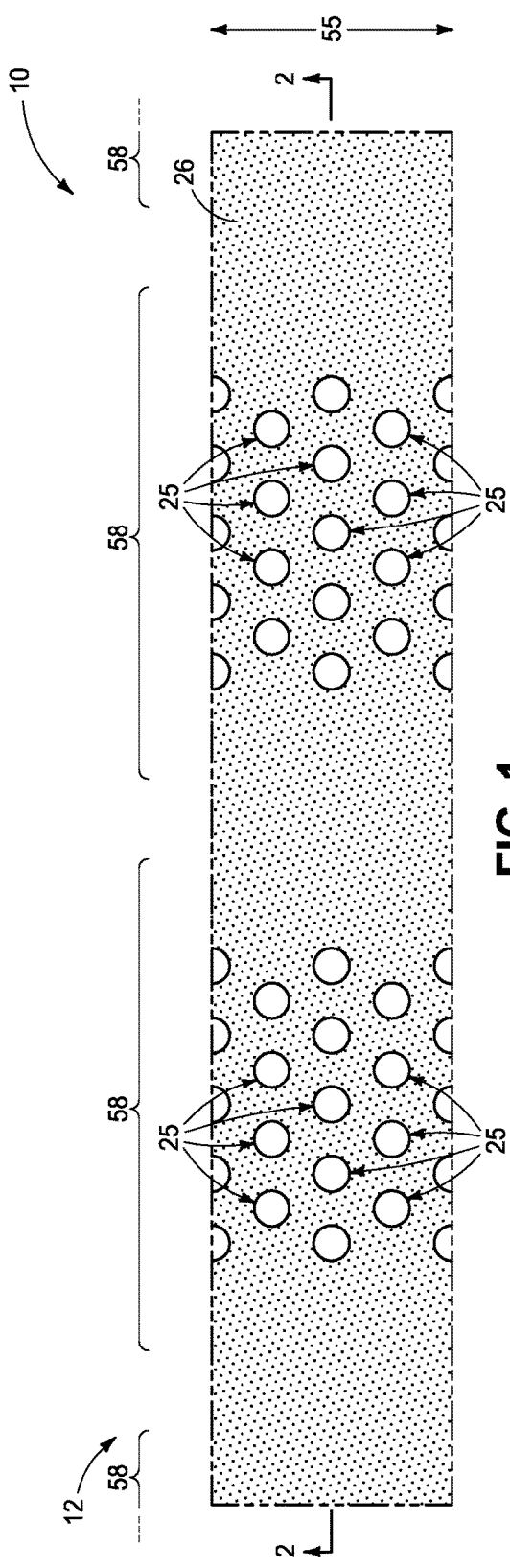
FIG. 1 is a diagrammatic cross-sectional view of a portion of a substrate in process in accordance with an embodiment of the invention and is taken through line 1-1 in FIG. 2.
Figure 2:
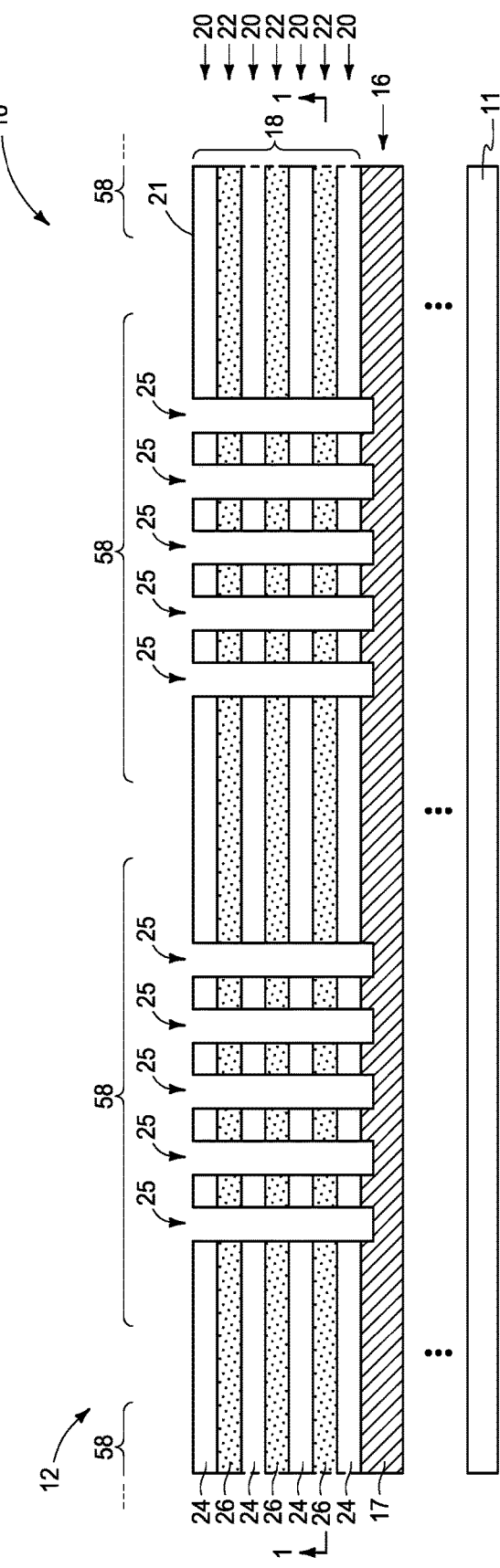
FIG. 2 is a diagrammatic cross-sectional view taken through line 2-2 in FIG. 1.
Figure 3:
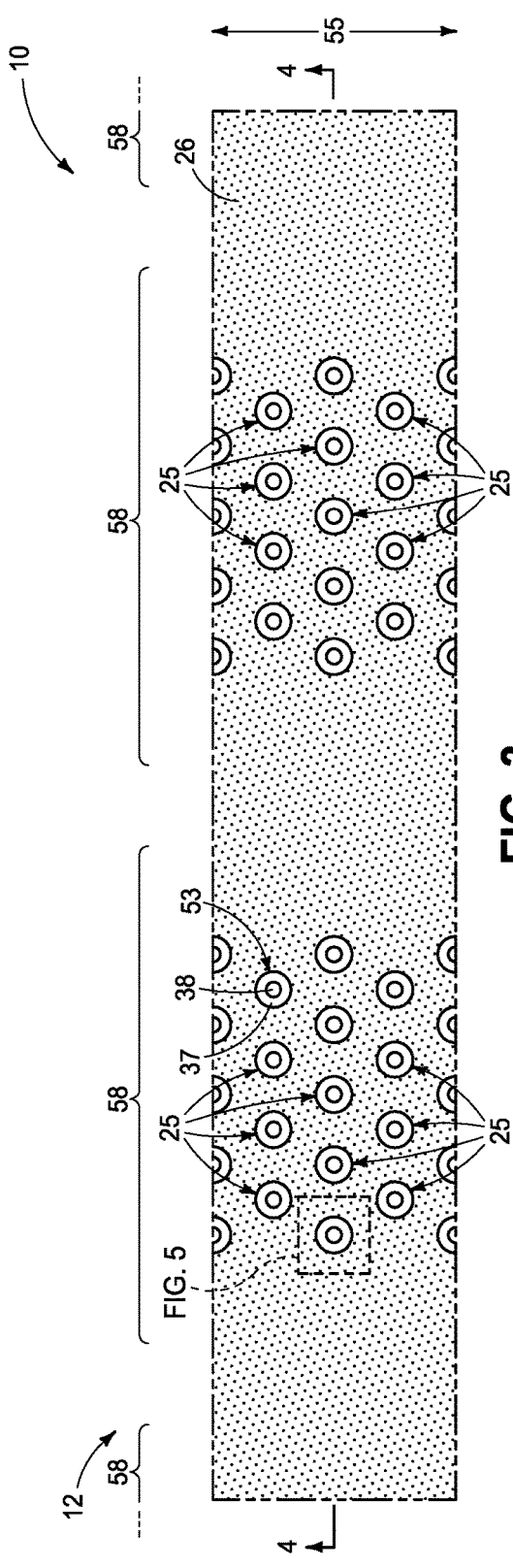
Figure 4:
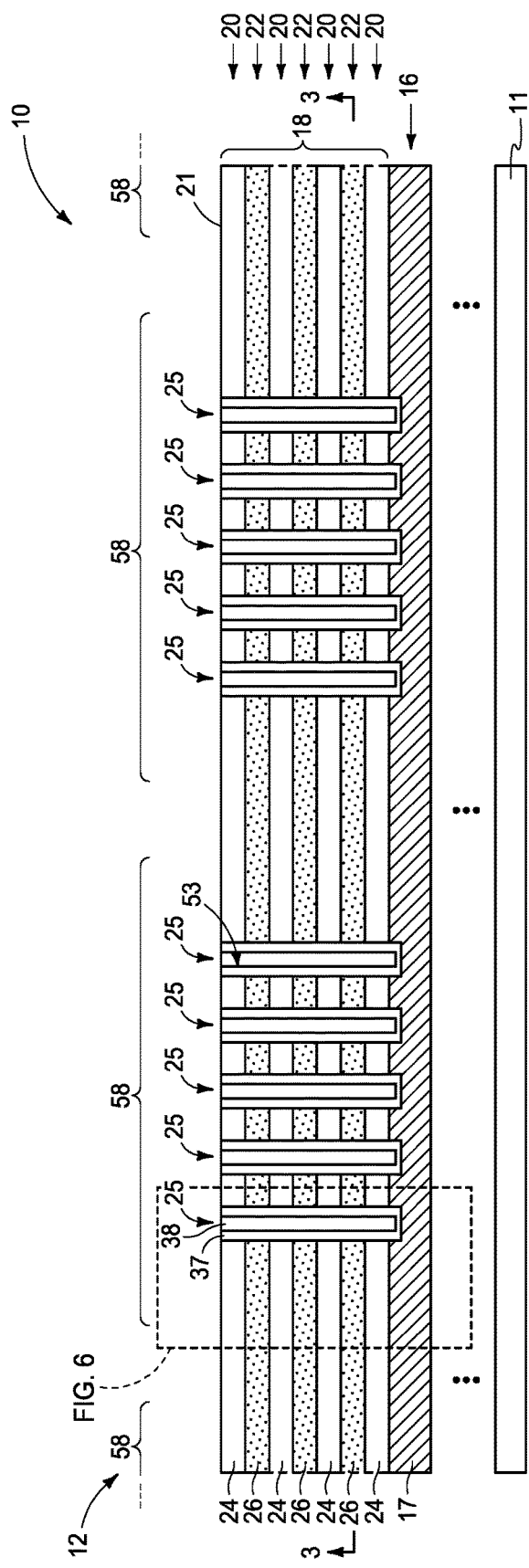
Figure 6:
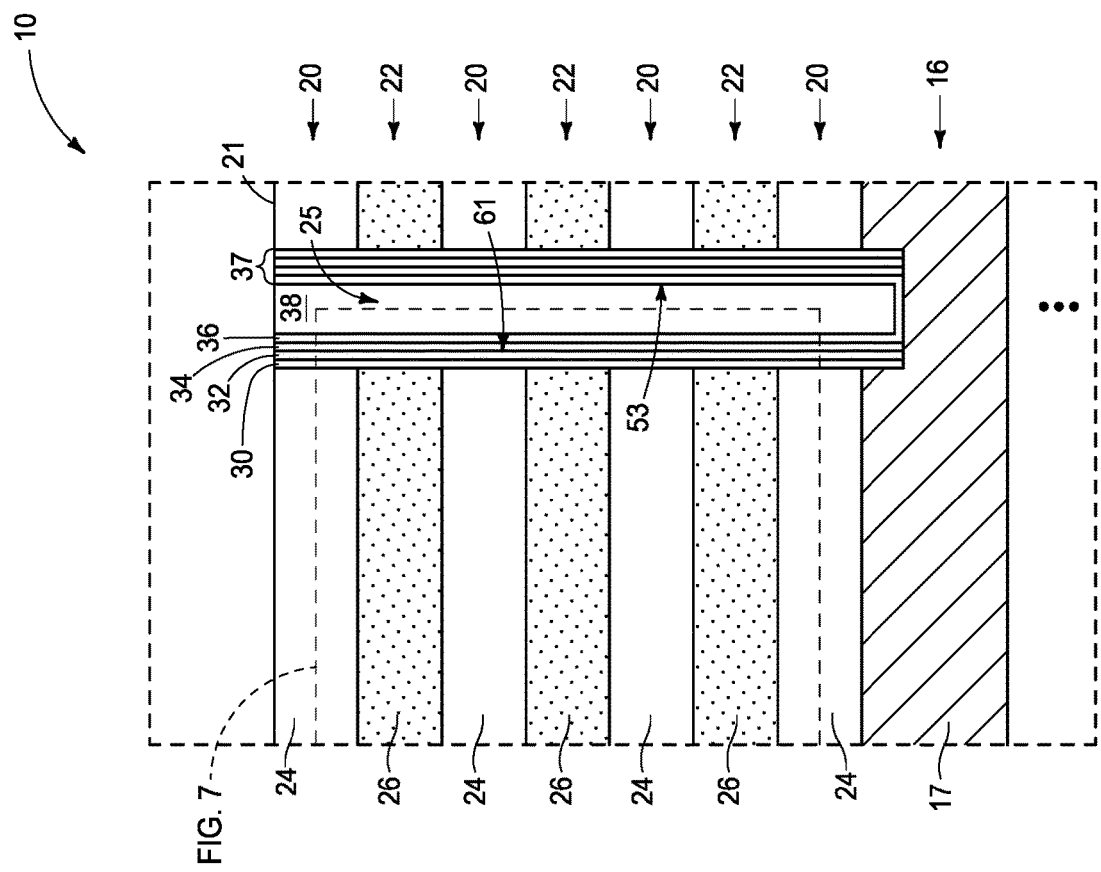
Figure 5:
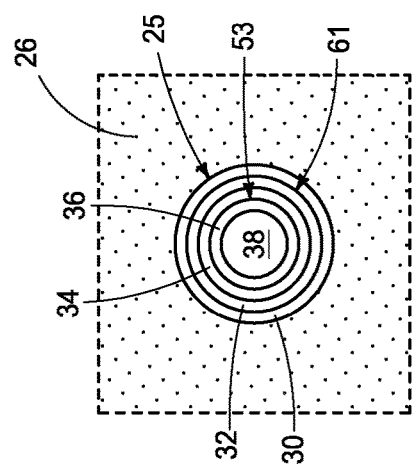

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 may be considered as having a top surface 21.

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3-8 show one embodiment where charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Regardless, storage material 32 is formed in individual storage-material strings 61. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel material strings 53 for better conductive connection to overlying circuitry (not shown).

Figure 7:
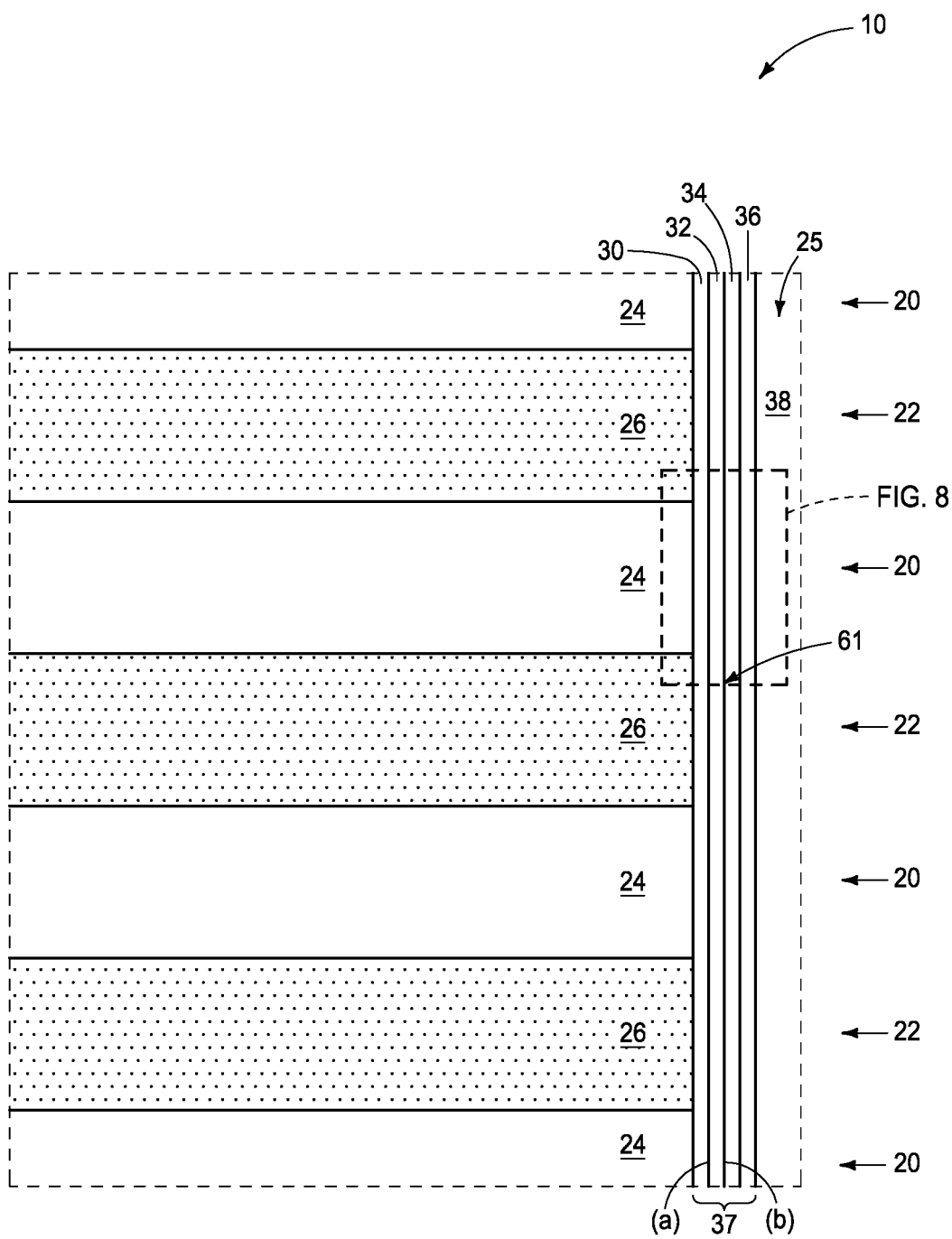
Figure 8:
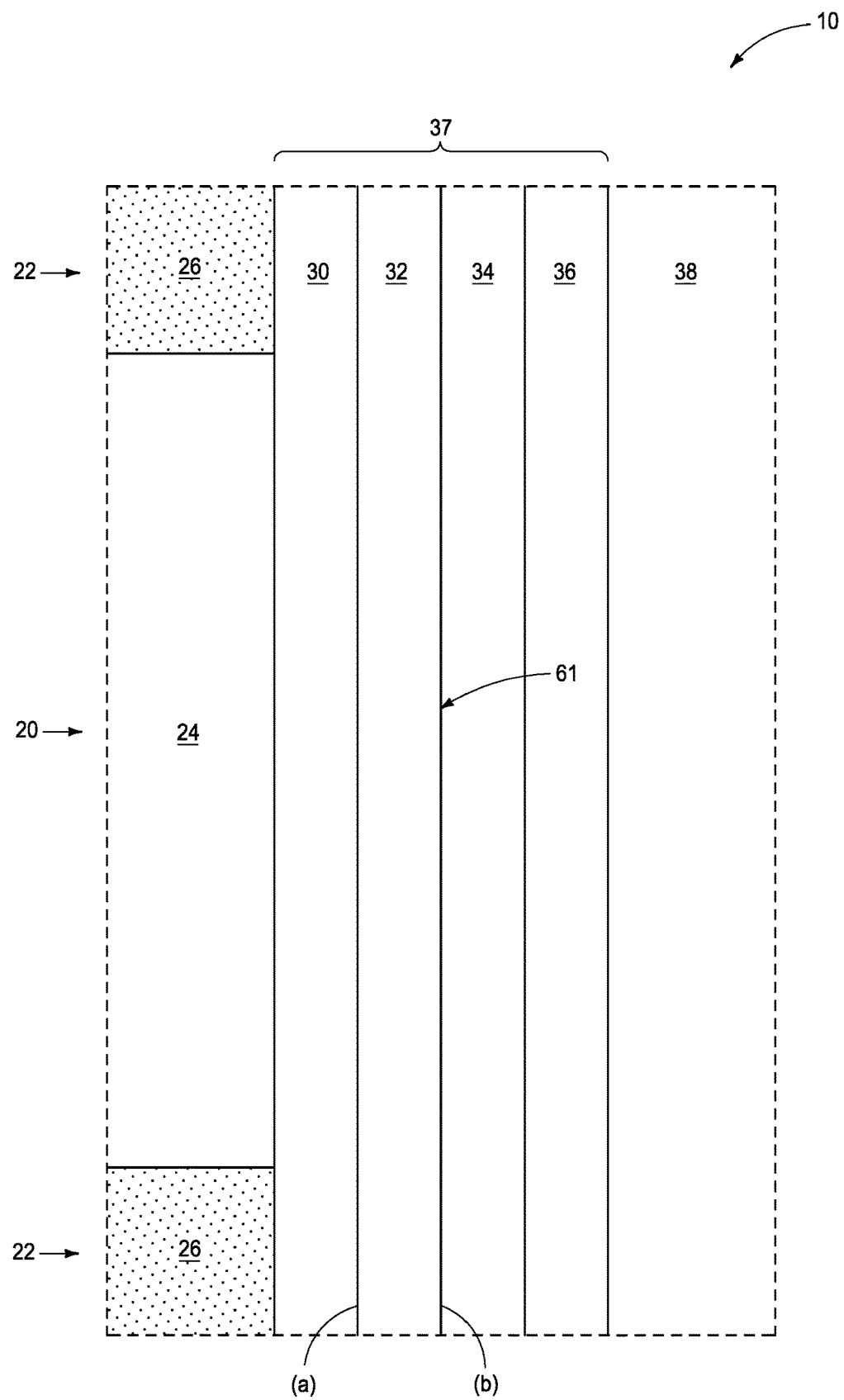
Figure 13:
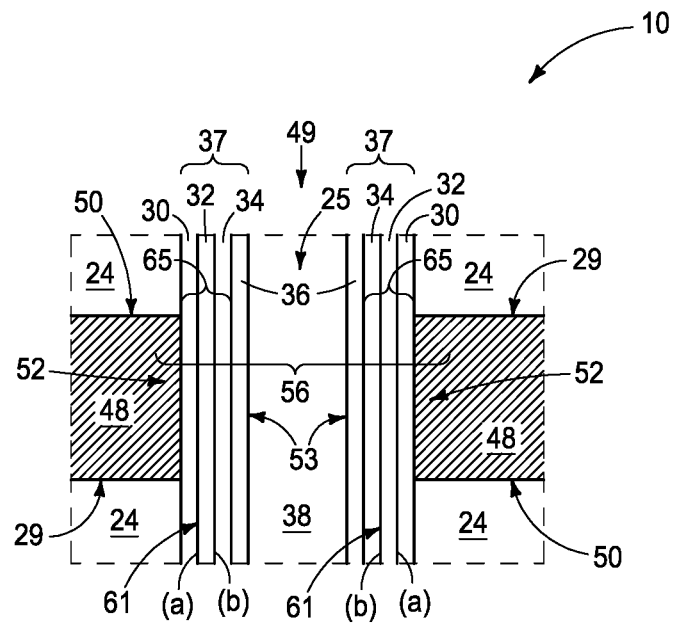
Figure 14:
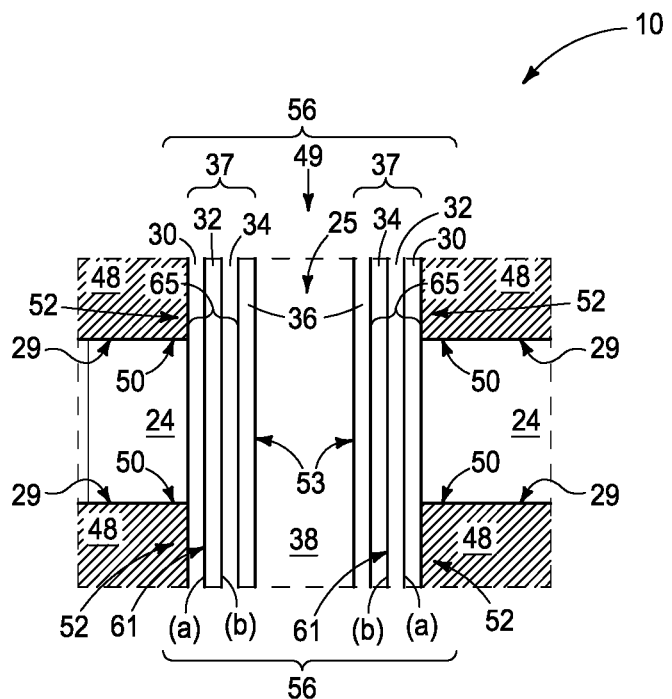

In some embodiments, and as designated in FIGS. 7 and 8, an insulative charge-blocking material 30 and storage material 32 may be considered as having an interface (a) and an insulative charge-passage material 34 and storage material 32 may be considered as having an interface (b).

Referring to FIGS. 9 and 10, horizontally-elongated trenches 40 have been formed (e.g., by anisotropic etching) into stack 18 to form laterally-spaced memory-block regions 58. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

Referring to FIGS. 11-14, and in one embodiment, material 26 (not shown) of conductive tiers 22 has been removed, for example by being isotropically etched away ideally selectively relative to the other exposed materials (e.g., using liquid or vapor $H_3PO_4$ as a primary etchant where material 26 is silicon nitride, and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) in first tiers 22. Such has also formed elevationally-extending strings 49 of individual transistors and/or memory cells 56 comprising channel-material strings 53, storage-material strings 61, and portions of conductive lines 29.

A thin insulative liner (e.g., $Al_2O_3$ and not shown) may be formed before forming conducting material 48. Approximate locations of transistors and/or memory cells 56 are indicated with a bracket in FIGS. 13 and 14 and some with dashed outlines in FIGS. 11 and 12, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIGS. 13 and 14) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 15:
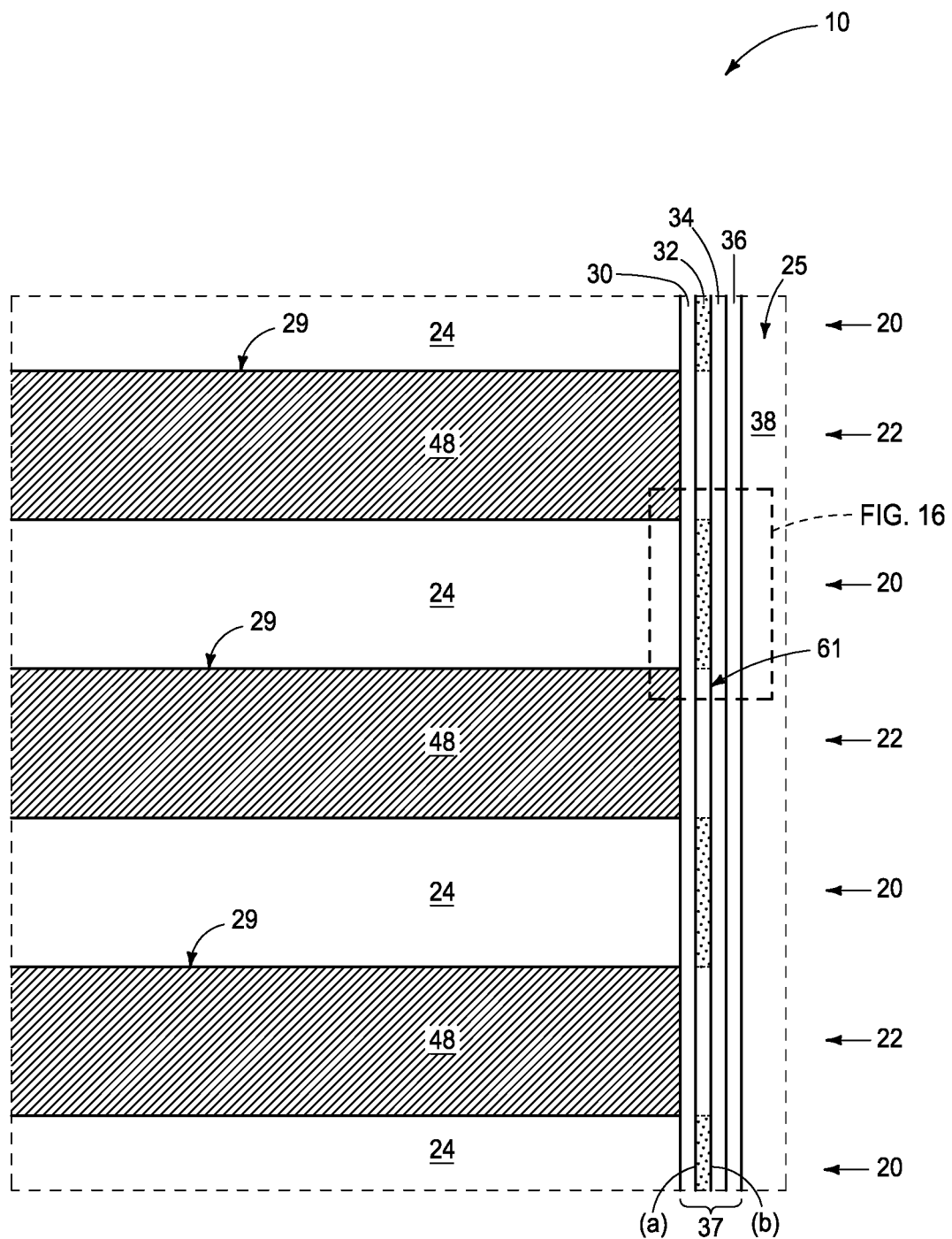
Figure 16:
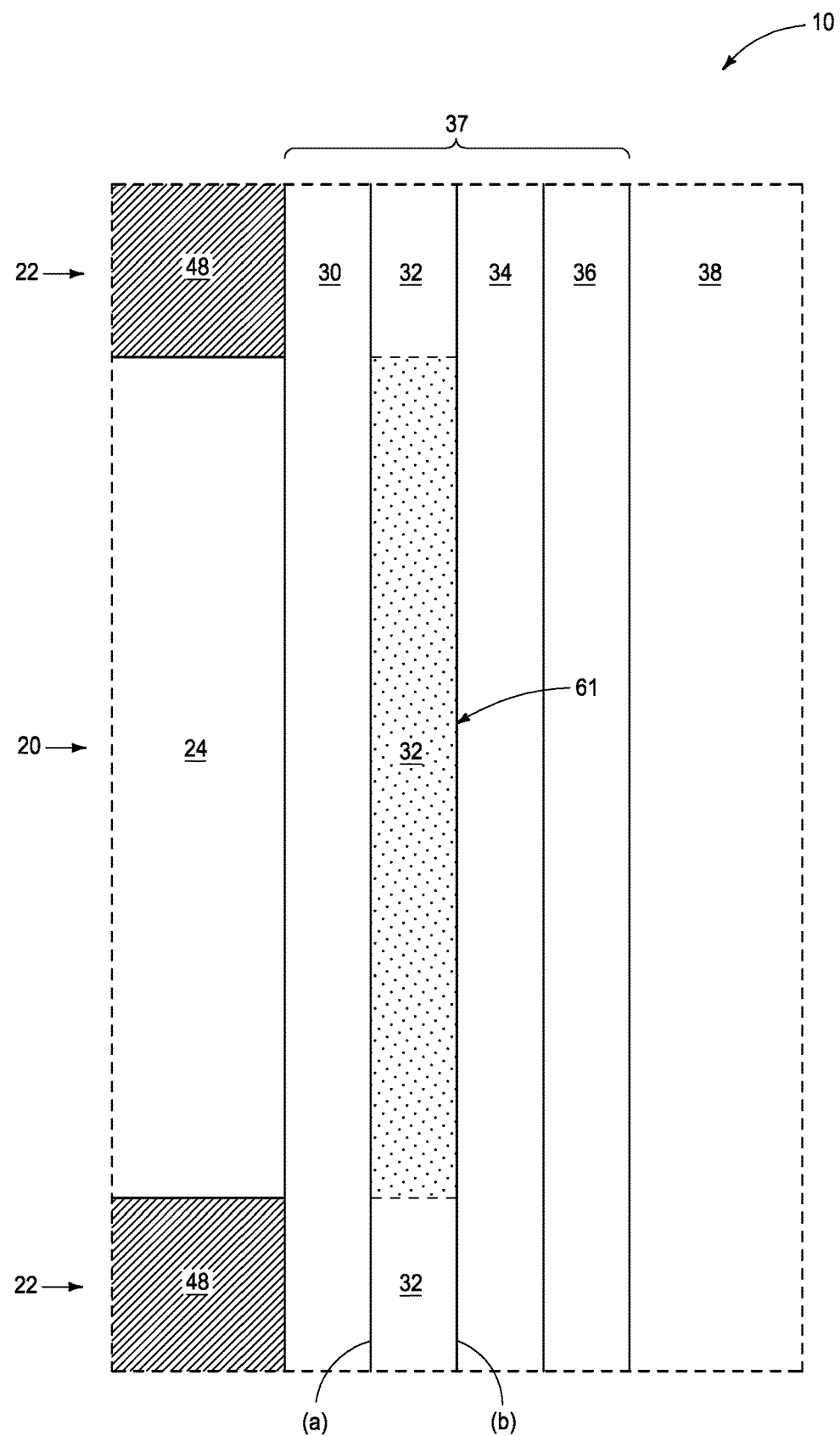
Figure 17:
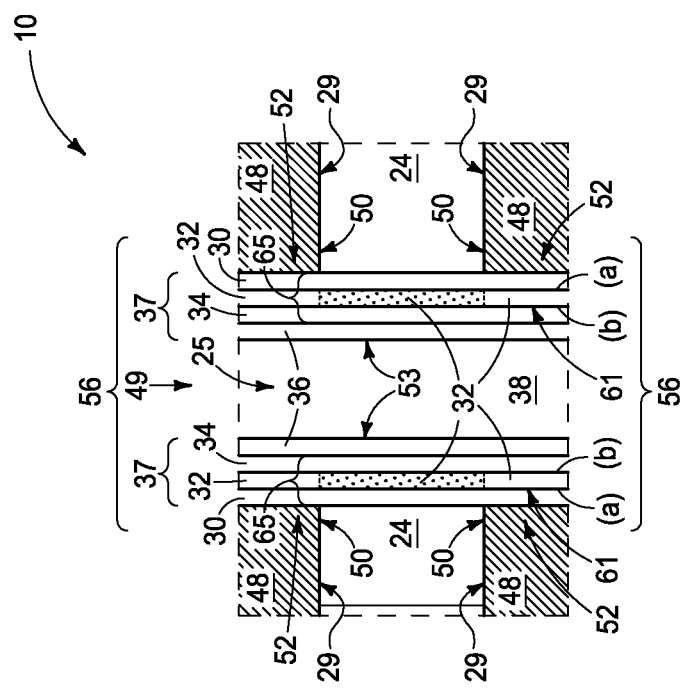

Referring to FIGS. 15-17 (corresponding to FIGS. 7, 8, and 14, respectively), intrinsic charge-transmissivity of storage material 32 of storage-material string 61 in insulative tiers 20 or in conductive tiers 22 has been modified such that at least some of storage material 32 of storage-material strings 61 in individual insulative tiers 22 is intrinsically less charge-transmissive than is storage material 32 in storage-material strings 61 in individual conductive tiers 22. For convenience and clarity in the larger-scale figures (e.g., FIGS. 15-17), less charge-transmissivity in storage material 32 is indicated with stippling in comparison to regions thereof which are more charge-transmissive that appear without stippling. Such modifying may be of storage material 32 in insulative tiers 20 or of storage material 32 in conductive tiers 22. As examples, the modifying if of storage material 32 in insulative tiers 20 reduces the intrinsic charge-transmissivity thereof and if of storage material 32 in conductive tiers 22 increases intrinsic charge-transmissivity thereof.

Any existing or future-developed method may be used to impart such modifying as described above, with some examples being provided as follows. In one example, such modifying comprises diffusing material from trenches 40 through insulative material 24 of insulative tiers 20 to storage material 32 of storage-material strings 61 that is in insulative tiers 20 to reduce intrinsic charge-transmissivity thereof. Such material may comprise, for example, a species derived from a gas and/or plasma. In one embodiment, the material of the diffusing is at least predominately from a plasma and in another embodiment is at least predominately from a gas. For example, construction 10 of FIGS. 11-14 could be exposed to $H_2$ and $H_2O$ (e.g., $H_2O$ as steam present at no greater than 25% by volume of total $H_2$ and $H_2O$) at a temperature of 800° C. to 1,200° C. As another example, such construction could be exposed to a plasma containing $H_2$ and $O_2$ (e.g., ratio of $H_2$ to $O_2$ of 0.1-0.5:1 by volume) at a temperature of 600° C. to 800° C. In each such examples, oxygen would be the primary diffusing species/material (from trenches 40 into and more so through insulative tiers 20 than conductive tiers 22) that goes into storage material 32 of insulative tiers 20 (through charge-blocking material 30). Such oxygen would one or both of locally oxidize such charge-storage material or inject oxygen atoms (e.g., that may not form an oxide) that, regardless, reduces intrinsic charge-transmissivity in storage material 32. Presence of hydrogen in each example may restrict undesired oxidation of conducting material 48 (when present) particularly where such comprises elemental-form or alloy-form metal.

As an alternate example, such modifying might be by radiant energy transmission, with in some embodiments such radiant energy resulting from impinging at least one of laser, microwave, or radio energy onto stack 18. In some embodiments, the radiant energy transmission is in insulative tiers 20 in greater degree than in conductive tiers 22 such that reducing of intrinsic charge-transmissivity results from heating storage material 32 in insulative tiers 20 more so than storage material 32 in conductive tiers 22.

The at least some of storage material 32 in individual insulative tiers 20 may be one or both of chemically compositionally different or physically different from storage material 32 in individual conductive tiers 22. In one embodiment, the at least some of storage material 32 in individual insulative tiers 20 is chemically compositionally the same as but physically different from storage material 32 in individual conductive tiers 22. For example, and by way of example only, different crystalline structures of same-chemical-composition storage materials may exhibit different charge-transmissivity. Further, amorphous verses crystalline materials may exhibit different charge-transmissivity.

In one embodiment, storage material 32 in individual conductive tiers 22 comprises $Si_3N_4$. In one such embodiment, the at least some of storage material 32 in individual insulative tiers 20 comprises $Si_3N_y$, where "y" is greater than 4 (not necessarily an integer), in one such embodiment comprises $Si_xO_yN_z$ (e.g., SiON), and in another embodiment comprises $SiO_2$. In one embodiment, the at least some of storage material 32 in individual insulative tiers 20 and storage material 32 in individual conductive tiers 22 each comprise $SiN_x$, with "x" (not necessarily an integer) being greater in the at least some storage material 32 in individual insulative tiers 20 than in storage material 32 in individual conductive tiers 22.

Any existing or future-developed manner that increases charge-transmissivity may be used as an act of modifying as referred to above. For example, in such instance(s), storage material 32 of storage-material strings 61 may initially be formed to be less charge-transmissive than it is desired to be in first/conductive tiers 22 in the finished circuitry construction. Storage material 32 in first/conductive tiers 22 may then be modified to increase its charge-transmissivity in comparison to that in second/insulative tiers 20. For example, and by way of example only, a $Si_3N_4$ charge-storage material 32 having chlorine atoms and/or hydrogen atoms therein is less charge-transmissive than is a $Si_3N_4$ charge-storage material 32 not having chlorine and/or hydrogen atoms therein. $Si_3N_4$ charge-storage material 32 having chlorine and/or hydrogen atoms therein can be locally heated in second/conductive tiers 22 as compared to that in second/insulative tiers 20 to remove the chlorine and/or hydrogen atoms therefrom, thereby increasing charge-transmissivity of material 32 in first/conductive tiers 22 compared to that in second/insulative tiers 20.

The above examples show forming conducting material 48 of conductive lines 29 in first tiers 22 after forming trenches 40 in accordance with example "gate-first" processing, and forming conducting material 48 of conductive lines 29 before the act of modifying intrinsic charge-transmissivity of storage material 32 in insulative tiers 20 or in conductive tiers 22. Alternately, for example in accordance with "gate-first" processing, conducting material 48 of conductive lines 29 in first tiers 22 may be formed before forming trenches 40. The above examples also show such modifying (e.g., by one or both of diffusing a material or by radiant energy transmission) being conducted after forming insulative charge-passage material 34 and after forming channel-material strings 53. Alternately, by way of examples, such modifying of intrinsic charge-transmissivity may occur before forming insulative charge-passage material 34. Further and regardless, such modifying of intrinsic charge-transmissivity may be conducted before or after forming channel-material strings 53.

Referring to FIGS. 18 and 19, intervening material 57 has been formed in trenches 40. Intervening material 57 may provide lateral electrical isolation (insulation) between immediately-laterally-adjacent memory-block regions 58 and ultimate memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may comprise conductive through-array-vias (not shown).

Any other attribute(s) or aspect(s) as shown and/or described herein with respect to other embodiments may be used in the embodiments shown and described with reference to FIGS. 1-19.

An alternate example embodiment is described with reference to FIGS. 20-22. Like numerals from the above-described embodiments have been used where appropriate, with some construction differences being indicated with the suffix "a" or with different numerals. FIGS. 20 and 21 correspond to and depict processing immediately-subsequent to that shown by FIGS. 9 and 10, but here with respect to a construction 10a and alternate to (and preceding) that shown by FIGS. 11-14. In such embodiment, material 24 of FIGS. 9 and 10 (not shown in FIGS. 20 and 21) of second tiers 20 comprises sacrificial material. FIGS. 20 and 21 show sacrificial material 24 of FIGS. 9 and 10 as having been removed (e.g., by isotropic etching) through trenches 40 selectively relative to first tiers 22, thus forming void space 42 in second tiers 20. In one such embodiment and as shown, such act of removing has exposed charge-blocking material 30.

Figure 22:
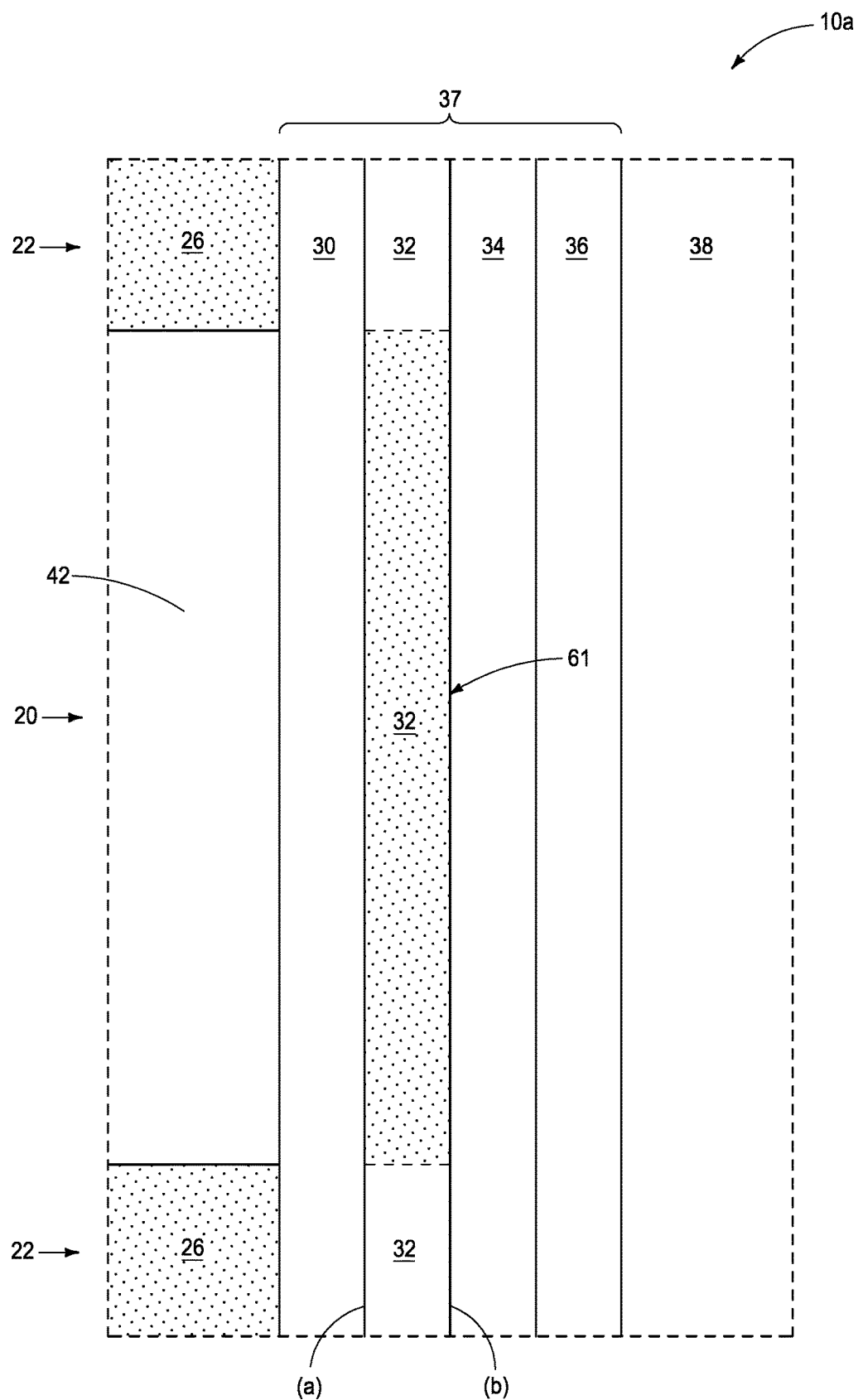

After such removing, in one embodiment, and referring to FIG. 22, material is provided into trenches 40 and diffused therefrom into void space 42 formed by the removal of sacrificial material 24 (not shown) in second tiers 20 to reduce intrinsic charge-transmissivity of at least some of storage material 32 of storage-material string 61 in individual second tiers 20 compared to intrinsic charge-transmissivity of storage material 32 of storage-material strings 61 in individual first tiers 22. The diffused material may diffuse into and remain in one or more of materials 30, 34, and 36 (not shown). Processing may subsequently occur as described above with respect to FIGS. 11-14, or otherwise. Any other attribute(s) or aspect(s) as shown and/or described herein with respect to other embodiments may be used.

Figure 23:
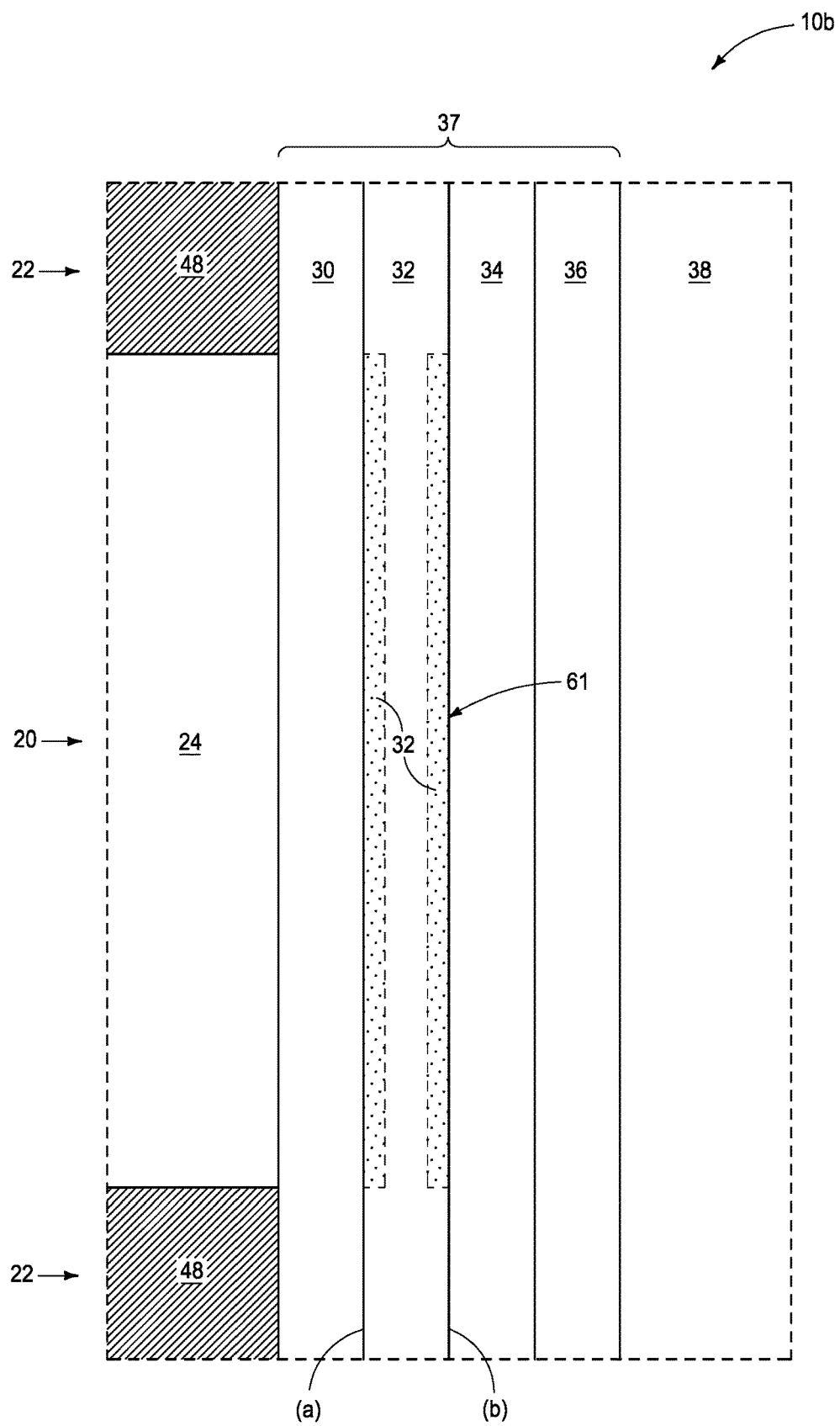

The above embodiments show examples where all storage material 32 in individual insulative tiers 20 is intrinsically less charge-transmissive than is storage material 32 in individual conductive tiers 22 (e.g., by stippling being shown in all material 32 that is in all of tiers 20). An alternate example embodiment 10b is shown and described with reference to FIG. 23. Like numerals from the above-described embodiments have been used where appropriate, with some construction differences being indicated with the suffix "b" or with different numerals. Storage-material string 61 of construction 10b is an example where less-than-all of storage material 32 in individual insulative tiers 20 is intrinsically less charge-transmissive than is storage material 32 in individual conductive tiers 22. In one such embodiment, none of storage material 32 in individual insulative tiers 20 is intrinsically more charge-transmissive than is storage material 32 in individual conductive tiers 22. By way of example only, such a construction may result by partial diffusion of material into and from opposite sides of storage material. Any other attribute(s) or aspect(s) as shown and/or described herein with respect to other embodiments may be used.

Figure 24:
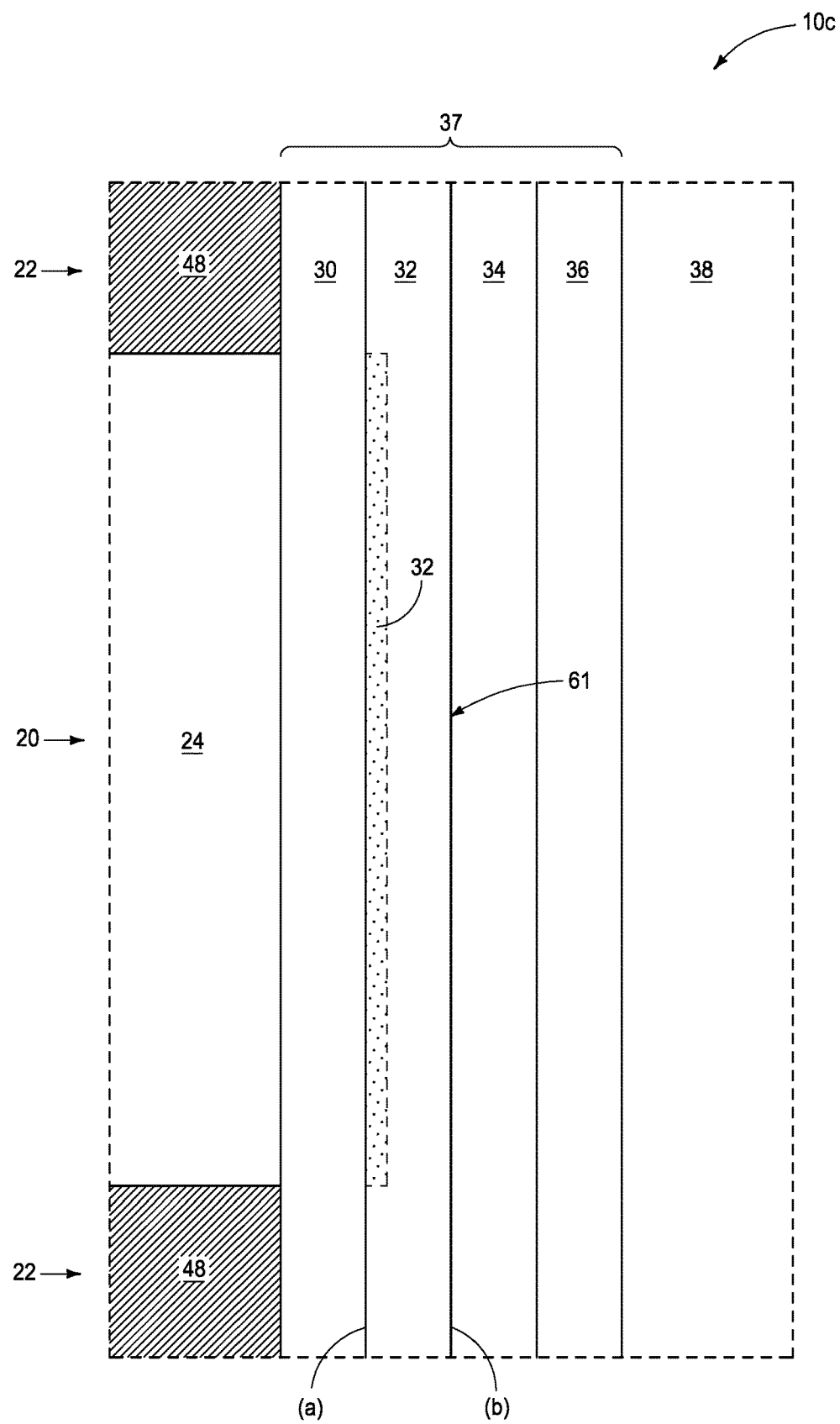
Figure 25:
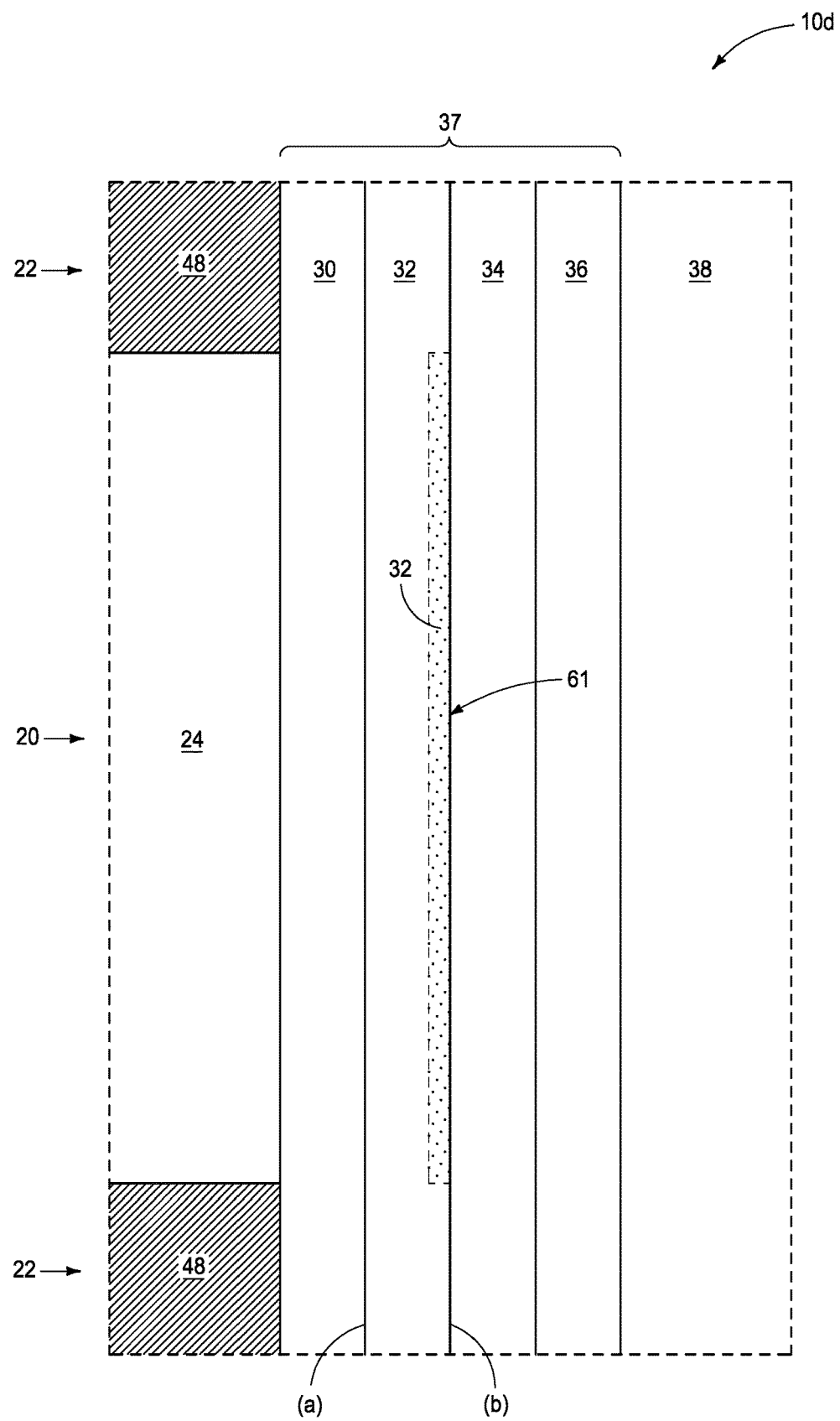

In one embodiment, storage material 32 of storage-material strings 61 in individual insulative tiers 20 is at interface (a) or interface (b), with such storage material 32 being intrinsically less charge-transmissive than is storage material 32 in storage-material strings 61 in individual conductive tiers 22. The above example embodiments show examples where the stippled storage material 32 is at both interface (a) and interface (b). Such also show examples where the stippled storage material 32 in individual insulative tiers 20 extends along all of interface (a) and all of interface (b). Alternately, the example stippled storage material 32 may be at 7139P.doc 15 interface (a) or interface (b) and not comprise (not be at) the other interface and/or the stippled storage material 32 in individual insulative tiers 20 may extend along less-than-all of one or both of interface (a) or along less-than-all of interface (b). Example such embodiment constructions 10c-10e are shown by way of examples only in FIGS. 24, 25, 26, with like numerals being used from the above-described embodiments with some construction differences being indicated with the suffixes "c", "d", and "e", respectively. Any other attribute(s) or aspect(s) as shown and/or described herein with respect to other embodiments may be used.

Figure 26:
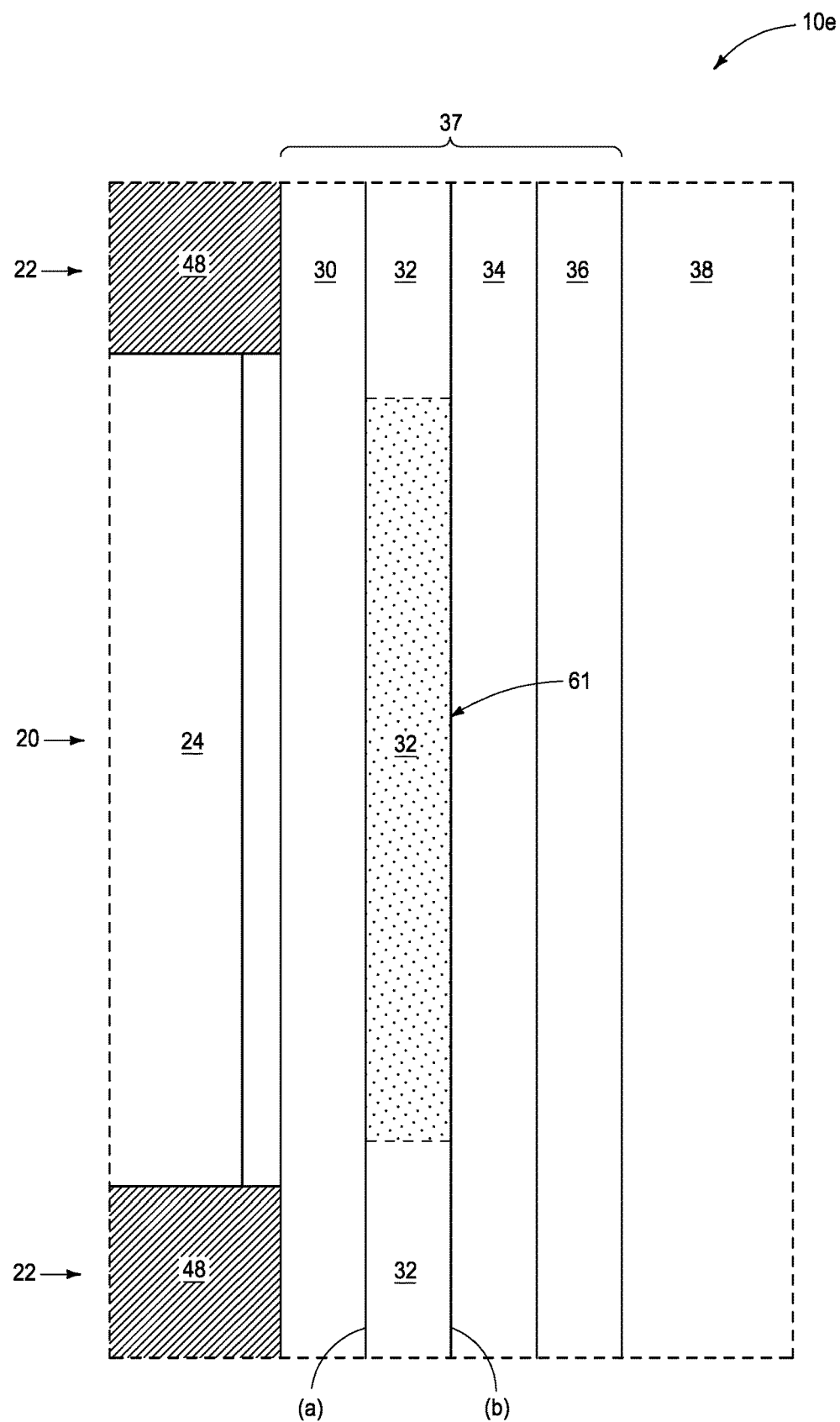

FIGS. 15-25 show examples where the at least some of the example stippled storage material 32 in individual insulative tiers 20 extends along all of the vertical thickness of individual insulative tiers 20 and FIG. 26 shows an example where such extends along less-than-all of the vertical thickness of individual insulative tiers 20.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Some embodiments of the invention include a memory array (e.g., 12) comprising strings (e.g., 49) of memory cells (e.g., 56). The memory array comprises a vertical stack (e.g., 18) comprising alternating insulative tiers (e.g., 20) and conductive tiers (e.g., 22). Strings of memory cells in the stack comprise channel-material strings (e.g., 53) and storage-material strings (e.g., 61) extending through the insulative tiers and the conductive tiers. At least some of the storage material of the storage-material strings in individual of the insulative tiers is intrinsically less charge-transmissive than is the storage material in the storage-material strings in individual of the conductive tiers. Any other attribute(s) or aspect(s) as shown and/or described herein with respect to other embodiments may be used.

Some embodiments of the invention include a memory array (e.g., 12) comprising strings (e.g., 49) of memory cells (e.g., 56). The memory array comprises a vertical stack (e.g., 18) comprising alternating insulative tiers (e.g., 20) and conductive tiers (e.g., 22). The conductive tiers individually comprise conductive lines (e.g., 29). The strings of memory cells in the stack comprise channel-material strings (e.g., 53) and storage-material strings (e.g., 61) extending through the insulative tiers and the conductive tiers. Individual of the memory cells are in individual of the conductive tiers and comprise the channel material (e.g., 36) of the channel-material strings, a gate region (e.g., 52) that is part of one of the conductive lines, and a memory structure (e.g., 65) laterally-between the gate region and the channel material. The memory structure comprises insulative charge-blocking material (e.g., 30) laterally-adjacent the gate region, insulative charge-passage material (e.g., 34) laterally-adjacent the channel material, and the storage material (e.g., 32) in the conductive tiers is laterally-between the charge-blocking material and the insulative charge-passage material. The storage material of the storage-material strings in individual of the insulative tiers at an interface (a) or at an interface (b) is intrinsically less charge-transmissive than is the storage material in the storage-material strings in the individual conductive tiers, where (a): of the insulative charge-blocking material and the storage material, and (b): of the insulative charge-passage material and the storage material. Any other attribute(s) or aspect(s) as shown and/or described herein with respect to other embodiments may be used The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming a memory array comprising strings of memory cells comprises forming strings of memory cells in a stack comprising vertically-alternating insulative tiers and conductive tiers. The conductive tiers individually comprise conductive lines. The memory-cell strings comprise channel-material strings and storage-material strings extending through the insulative tiers and the conductive tiers. Intrinsic charge-transmissivity of the storage material of the storage-material strings in the insulative tiers or in the conductive tiers is modified such that at least some of the storage material of the storage-material strings in individual of the insulative tiers is intrinsically less charge-transmissive than is the storage material in the storage-material strings in individual of the conductive tiers.

In some embodiments, a method of forming a memory array comprising strings of memory cells comprises forming storage-material strings in a stack comprising vertically-alternating first tiers and second tiers. The second tiers comprise sacrificial material. Horizontally-elongated trenches are formed in the stack. The sacrificial material is removed through the trenches selectively relative to the first tiers. After the removing, material is diffused from the trenches into void space in the second tiers to the storage material of the storage-material strings in the second tiers to reduce intrinsic charge-transmissivity of at least some of the storage material of the storage-material strings in individual of the second tiers compared to intrinsic charge-transmissivity of the storage material of the storage-material strings in individual of the first tiers. Conductive lines are formed in the first tiers and form strings of memory cells in the stack comprising channel-material strings and the storage-material strings.

In some embodiments, a memory array comprising strings of memory cells comprises a vertical stack comprising alternating insulative tiers and conductive tiers. The strings of memory cells in the stack comprise channel-material strings and storage-material strings extending through the insulative tiers and the conductive tiers. At least some of the storage material of the storage-material strings in individual of the insulative tiers are intrinsically less charge-transmissive than is the storage material in the storage-material strings in individual of the conductive tiers.

In some embodiments, a memory array comprising strings of memory cells comprises a vertical stack comprising alternating insulative tiers and conductive tiers. The conductive tiers individually comprise conductive lines. Strings of memory cells in the stack comprise channel-material strings and storage-material strings extending through the insulative tiers and the conductive tiers. Individual of the memory cells are in individual of the conductive tiers and comprise the channel material of the channel-material strings, a gate region that is part of one of the conductive lines, and a memory structure laterally-between the gate region and the channel material. The memory structure comprises insulative charge-blocking material laterally-adjacent the gate region, insulative charge-passage material laterally-adjacent the channel material, and the storage material in the conductive tiers that is laterally-between the charge-blocking material and the insulative charge-passage material. The storage material of the storage-material strings in individual of the insulative tiers at an interface (a) or at an interface (b) are intrinsically less charge-transmissive than is the storage material in the storage-material strings in the individual conductive tiers, where (a): of the insulative charge-blocking material and the storage material, and (b): of the insulative charge-passage material and the storage material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
   a vertical stack comprising alternating insulative tiers and conductive tiers;
   strings of memory cells in the stack comprising channel-material strings comprising channel material and storage-material strings comprising storage material, the storage-material strings extending through the insulative tiers and the conductive tiers; and
   at least some of the storage material of the storage-material strings in individual of the insulative tiers being intrinsically less charge-transmissive than is the storage material in the storage-material strings in individual of the conductive tiers.

2. The memory array of claim 1 wherein all the storage material in the individual insulative tiers is intrinsically less charge-transmissive than is the storage material in the individual conductive tiers.

3. The memory array of claim 1 wherein less-than-all of the storage material in the individual insulative tiers is intrinsically less charge-transmissive than is the storage material in the individual conductive tiers.

4. The memory array of claim 3 wherein none of the storage material in the individual insulative tiers is intrinsically more charge-transmissive than is the storage material in the individual conductive tiers.

5. The memory array of claim 3 wherein,
   individual of the memory cells are in the individual conductive tiers and comprise the channel material of the channel-material strings, a conductive gate region, and a memory structure laterally-between the gate region and the channel material; the memory structure comprising a charge-blocking region laterally-adjacent the gate region, an insulative charge-passage material laterally-adjacent the channel material, and the storage material in the conductive tiers that is laterally-between the charge-blocking region and the insulative charge-passage material; and
   said at least some of the storage material in the individual insulative tiers being at an interface of the insulative charge-passage material and the storage material.

6. The memory array of claim 1 wherein said at least some of the storage material in the individual insulative tiers extends along all vertical thickness of the individual insulative tiers.

7. The memory array of claim 1 wherein said at least some of the storage material in the individual insulative tiers extends along less-than-all vertical thickness of the individual insulative tiers.

8. The memory array of claim 1 wherein said at least some of the storage material in the individual insulative tiers is chemically compositionally different from the storage material in the individual conductive tiers.

9. The memory array of claim 1 wherein said at least some of the storage material in the individual insulative tiers is physically different from the storage material in the individual conductive tiers.

10. The memory array of claim 9 wherein said at least some of the storage material in the individual insulative tiers is chemically compositionally the same as the storage material in the individual conductive tiers.

11. The memory array of claim 1 wherein said at least some of the storage material in the individual insulative tiers and the storage material in the individual conductive tiers each comprise $SiN_x$, with "x" being greater in said at least some than in the storage material in the individual conductive tiers.

12. The memory array of claim 1 wherein the storage material in the individual conductive tiers comprises $Si_3N_4$ and said at least some of the storage material in the individual insulative tiers comprises $Si_3N_y$, where "y" is greater than 4.

13. The memory array of claim 1 wherein the storage material in the individual conductive tiers comprises $Si_3N_4$ and said at least some of the storage material in the individual insulative tiers comprises $Si_xO_yN_z$.

14. The memory array of claim 1 wherein the storage material in the individual conductive tiers comprises $Si_3N_4$ and said at least some of the storage material in the individual insulative tiers comprises $SiO_2$.

15. A memory array comprising strings of memory cells, comprising:
a vertical stack comprising alternating insulative tiers and conductive tiers, the conductive tiers individually comprising conductive lines;
strings of memory cells in the stack comprising channel-material strings comprising channel material and storage-material strings comprising storage material, the storage-material strings extending through the insulative tiers and the conductive tiers; individual of the memory cells being in individual of the conductive tiers and comprising the channel material of the channel-material strings, a gate region that is part of one of the conductive lines, and a memory structure laterally-between the gate region and the channel material; the memory structure comprising insulative charge-blocking material laterally-adjacent the gate region, insulative charge-passage material laterally-adjacent the channel material, and the storage material in the conductive tiers that is laterally-between the charge-blocking material and the insulative charge-passage material; and
the storage material of the storage-material strings in individual of the insulative tiers at an interface (a) or at an interface (b) being intrinsically less charge-transmissive than is the storage material in the storage-material strings in the individual conductive tiers, where
(a): of the insulative charge-blocking material and the storage material; and
(b): of the insulative charge-passage material and the storage material.

16. The memory array of claim 15 comprising the interface (a).

17. The memory array of claim 16 not comprising the interface (b).

18. The memory array of claim 16 wherein the storage material in the individual insulative tiers extends along all of the interface (a).

19. The memory array of claim 16 wherein the storage material in the individual insulative tiers extends along less-than-all of the interface (a).

20. The memory array of claim 15 comprising the interface (b).

21. The memory array of claim 20 not comprising the interface (a).

22. The memory array of claim 20 wherein the storage material in the individual insulative tiers extends along all of the interface (b).

23. The memory array of claim 20 wherein the storage material in the individual insulative tiers extends along less-than-all of the interface (b).

24. The memory array of claim 15 comprising the interface (a) and the interface (b).

25. The memory array of claim 15 wherein all the storage material in the individual insulative tiers is intrinsically less charge-transmissive than is the storage material in the individual conductive tiers.

26. The memory array of claim 15 wherein less-than-all of the storage material in the individual insulative tiers is intrinsically less charge-transmissive than is the storage material in the individual conductive tiers.

* * * * *